(12) United States Patent
Nakamura et al.

(10) Patent No.: US 8,178,940 B2
(45) Date of Patent: May 15, 2012

(54) SCHOTTKY BARRIER DIODE AND METHOD FOR USING THE SAME

(75) Inventors: Tomonori Nakamura, Yokosuka (JP);
Hidekazu Tsuchida, Yokosuka (JP);
Toshiyuki Miyanagi, Yokosuka (JP)

(73) Assignee: Central Research Institute of Electric Power Industry, Tokyo (JP)

( * ) Notice: Subject to any disclaimer, the term of this patent is extended or adjusted under 35 U.S.C. 154(b) by 221 days.

(21) Appl. No.: 12/094,922

(22) PCT Filed: Nov. 22, 2006

(86) PCT No.: PCT/JP2006/323272
§ 371 (c)(1),
(2), (4) Date: Aug. 7, 2008

(87) PCT Pub. No.: WO2007/060970
PCT Pub. Date: May 31, 2007

(65) Prior Publication Data
US 2009/0243026 A1    Oct. 1, 2009

(30) Foreign Application Priority Data
Nov. 25, 2005    (JP) ................. 2005-340299

(51) Int. Cl.
*H01L 29/872* (2006.01)
(52) U.S. Cl. .......... 257/473; 257/77; 257/471; 257/472; 257/485; 257/486; 257/E29.104; 257/E29.338

(58) Field of Classification Search .......... 257/E29.338, 257/76, 77, 471–486, E29.104; 438/570, 438/92, 571, 572, 582
See application file for complete search history.

(56) References Cited

U.S. PATENT DOCUMENTS

2003/0183895 A1* 10/2003 Okamura et al. .......... 257/454
2005/0230807 A1* 10/2005 Kodani et al. ............. 257/692

FOREIGN PATENT DOCUMENTS

| JP | 11233796 A | 8/1999 |
| JP | 2000299479 A | 10/2000 |
| JP | 2001015771 A | 1/2001 |
| JP | 2001053293 A | 2/2001 |
| JP | 2003243323 A | 8/2003 |

* cited by examiner

*Primary Examiner* — Lynne Gurley
*Assistant Examiner* — Naima Kearney
(74) *Attorney, Agent, or Firm* — The Webb Law Firm

(57) ABSTRACT

An intermediate metal film is formed between a Schottky electrode and a pad electrode. A Schottky barrier height between the intermediate metal film and a silicon carbide epitaxial film is equivalent to or higher than a Schottky barrier height between the Schottky electrode and the silicon carbide epitaxial film. By this configuration, an excess current and a leak current through a pin-hole can be suppressed even in the case in which a Schottky barrier height between the pad electrode and the silicon carbide epitaxial film is less than the Schottky barrier height between the Schottky electrode and the silicon carbide epitaxial film.

3 Claims, 4 Drawing Sheets

Prior Art

SCHOTTKY BARRIER DIODE AND METHOD FOR USING THE SAME

TECHNICAL FIELD

The present invention relates to a Schottky barrier diode and use of the Schottky barrier diode. More specifically, the present invention relates to a Schottky barrier diode in which a Schottky electrode is formed on the surface of a silicon carbide epitaxial film grown from the surface of a silicon carbide single-crystal substrate and in which a pad electrode for being electrically connected to the outside is formed on the Schottky electrode.

BACKGROUND ART

Silicon carbide (SiC) is a wide gap semiconductor having excellent physical properties such as an approximately triple band gap, an approximately double saturated drift velocity, and an approximately decuple dielectric breakdown field strength as compared with silicon (Si). Consequently, silicon carbide has been developed as a material of a power semiconductor device, and Schottky barrier diodes manufactured by using SiC have been on the market.

FIG. 3 is a cross-sectional view showing a conventional SiC Schottky barrier diode. The SiC Schottky barrier diode 11 is mainly composed of a SiC single-crystal substrate 2 that is a slice in a wafer shape of SiC bulk single crystal grown by a sublimation method or the like, a SiC epitaxial film 3 grown from the surface of the SiC single-crystal substrate 2 by the chemical vapor deposition (CVD), a Schottky electrode 4 formed on the surface of the SiC epitaxial film 3 by a method such as sputtering or vacuum deposition, and an ohmic electrode 7 formed on the other surface of the SiC single-crystal substrate 2 (Patent documents 1 and 2).

A pad electrode 6 is formed on the Schottky electrode 4. An electrical connection to an external circuit such as a circuit board can be made via the pad electrode 6 by a method such as wire bonding, solder connection or terminal connection.

Patent document 1: Japanese Patent Application Laid-Open Publication No. 2000-299479

Patent document 2: Japanese Patent Application Laid-Open Publication No. 2003-243323

DISCLOSURE OF THE INVENTION

As shown in an enlarged view of FIG. 4, in the manufacturing process of the above SiC Schottky diode, a small hole (pin-hole 9) is formed in the Schottky electrode 4 in some cases. Such local pin-holes 9 provide regions in which the pad electrode 6 and the SiC epitaxial film 3 are directly adjacent to each other.

In some cases, gold or the like is used for the pad electrode 6 as described in Patent document 2. However, in many cases, a metal material having a small work function such as aluminum is used for the pad electrode 6. A Schottky barrier height (SBH) at a junction locally formed between the pad electrode 6 and the n-type SiC epitaxial film 3 is smaller than an SBH at a junction between the Schottky electrode 4 and the SiC epitaxial film 3.

In the case in which the SBH is small locally as described above, a current easily flows through the pin-hole 9, and consequently an excess current flows during a forward operation, and a reverse-direction leak current is increased during a reverse operation. Such a diode having a deteriorated performance cannot be shipped as a product, thereby reducing a yield.

An object of the present invention is to provide a Schottky barrier diode that can reliably prevent an excess current during a forward operation and an increase in reverse-direction leak current caused by a pin-hole formed in the Schottky electrode.

Another object of the present invention is to provide use of a Schottky barrier diode whereby an excess current during a forward operation and an increase in reverse-direction leak current caused by a pin-hole formed in the Schottky electrode can be reliably prevented.

SUMMARY OF THE INVENTION

In a Schottky barrier diode comprising a Schottky electrode formed on the surface of a silicon carbide epitaxial film grown from the surface of a silicon carbide single-crystal substrate, and a pad electrode formed on the Schottky electrode for being electrically connected to the outside, the improvement comprises an intermediate metal film between the Schottky electrode and the pad electrode, wherein a Schottky barrier height between the intermediate metal film and the silicon carbide epitaxial film is equivalent to or higher than a Schottky barrier height between the Schottky electrode and the silicon carbide epitaxial film.

In the Schottky barrier diode in accordance with the present invention, a Schottky barrier height between the pad electrode and the silicon carbide epitaxial film may be lower than the Schottky barrier height between the Schottky electrode and the silicon carbide epitaxial film.

In use of the Schottky barrier diode by passing a current in a forward direction and a reverse direction that are switched, the improvement comprises preventing an excess current from passing through a pin-hole in the Schottky electrode by the intermediate metal film during the forward operation.

In use of the Schottky barrier diode by passing a current in a forward direction and a reverse direction that are switched, the improvement comprises preventing the current from leaking in a reverse direction through a pin-hole in the Schottky electrode by the intermediate metal film.

The Schottky barrier diode in accordance with the present invention reliably prevents an excess current during a forward operation and an increase in reverse-direction leak current caused by a pin-hole formed in the Schottky electrode. Consequently, a yield in a mass production can be improved.

According to the use of the Schottky barrier diode in accordance with the present invention, an excess current during a forward operation and an increase in reverse-direction leak current caused by a pin-hole formed in the Schottky electrode can be reliably prevented.

BEST MODE OF CARRYING OUT THE INVENTION

Figure 1:
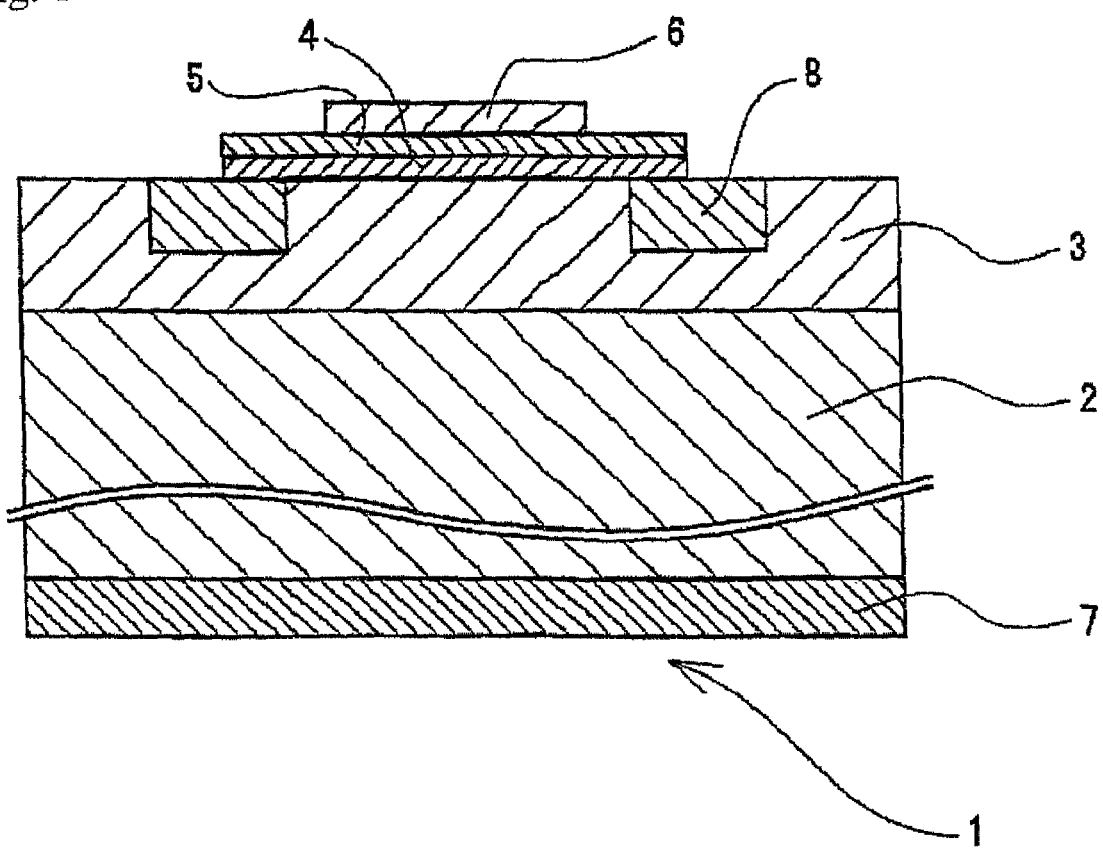
FIG. 1 is a cross-sectional view showing an embodiment of a Schottky barrier diode in accordance with the present invention.

An embodiment (example) of the present invention will be described below in detail with reference to the drawings. FIG.

1 is a cross-sectional view showing an embodiment of a Schottky barrier diode in accordance with the present invention. For the Schottky barrier diode 1, an n-type SiC epitaxial film 3 is formed on the surface of an n-type SiC single-crystal substrate 2.

A Schottky electrode 4 made of molybdenum is formed on the surface of the SiC epitaxial film 3. On the other hand, an ohmic electrode 7 made of nickel is formed on the rear face of the SiC single-crystal substrate 2, opposite to the Schottky electrode. A pad electrode 6 made of aluminum is formed on the side of the upper surface of the Schottky electrode 4.

Figure 2:
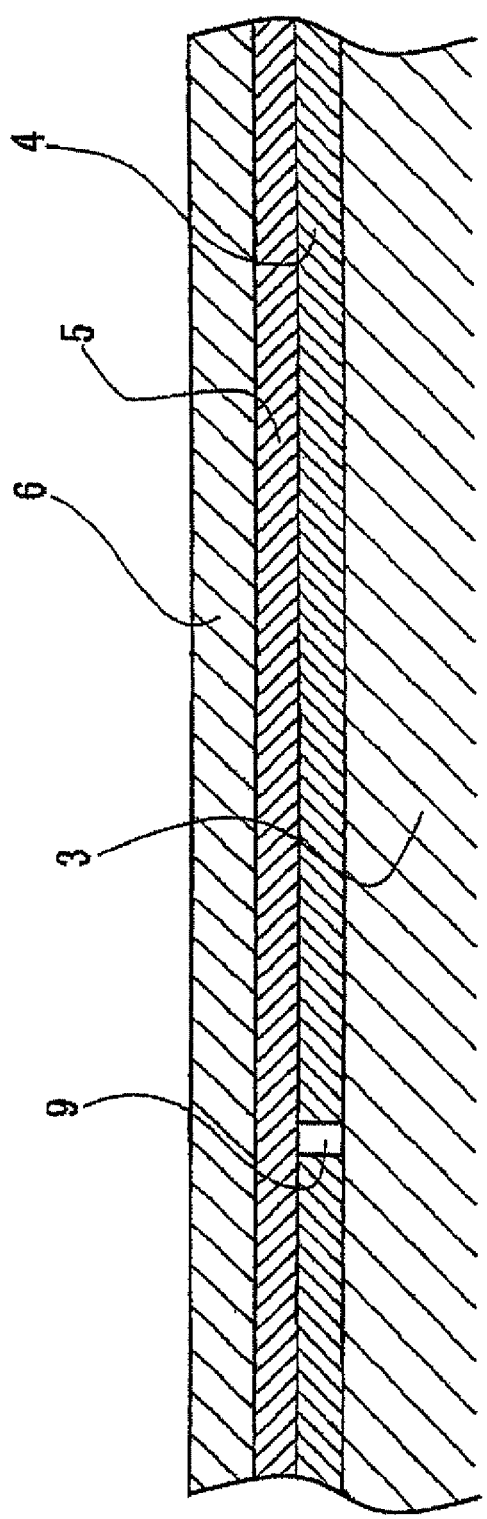
FIG. 2 is a partially enlarged cross-sectional view showing the case in which a pin-hole is formed in a Schottky electrode in a Schottky barrier diode in accordance with the present invention.
Figure 3:
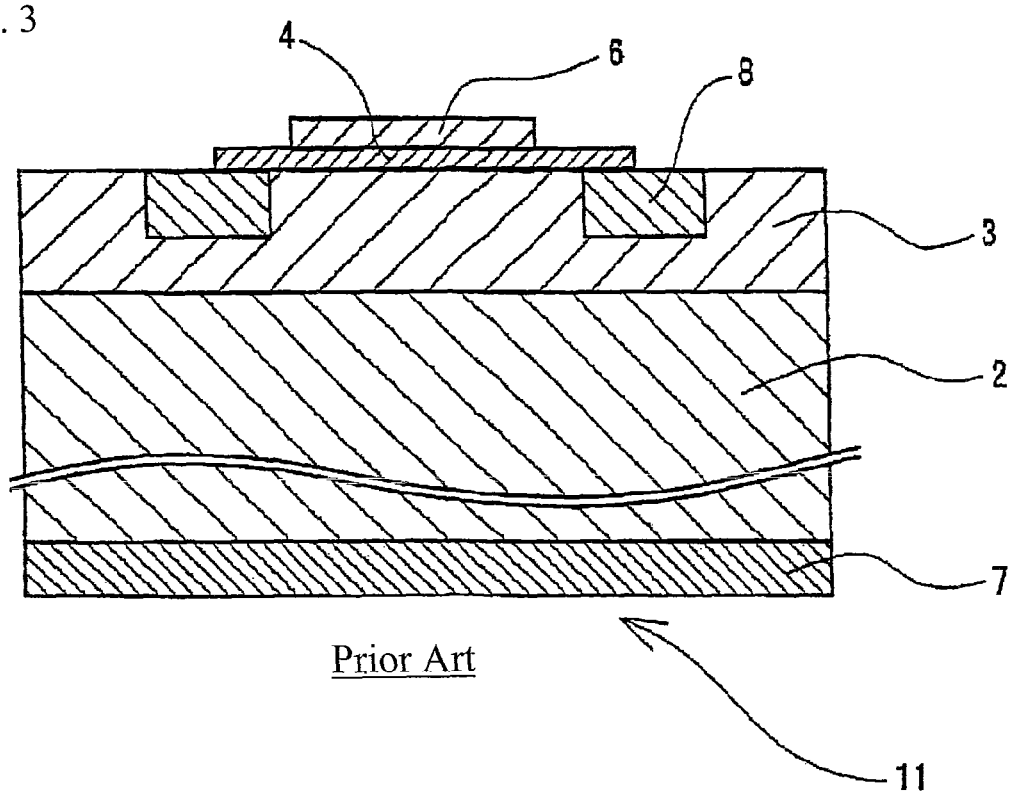
FIG. 3 is a cross-sectional view showing a conventional Schottky barrier diode.
Figure 4:
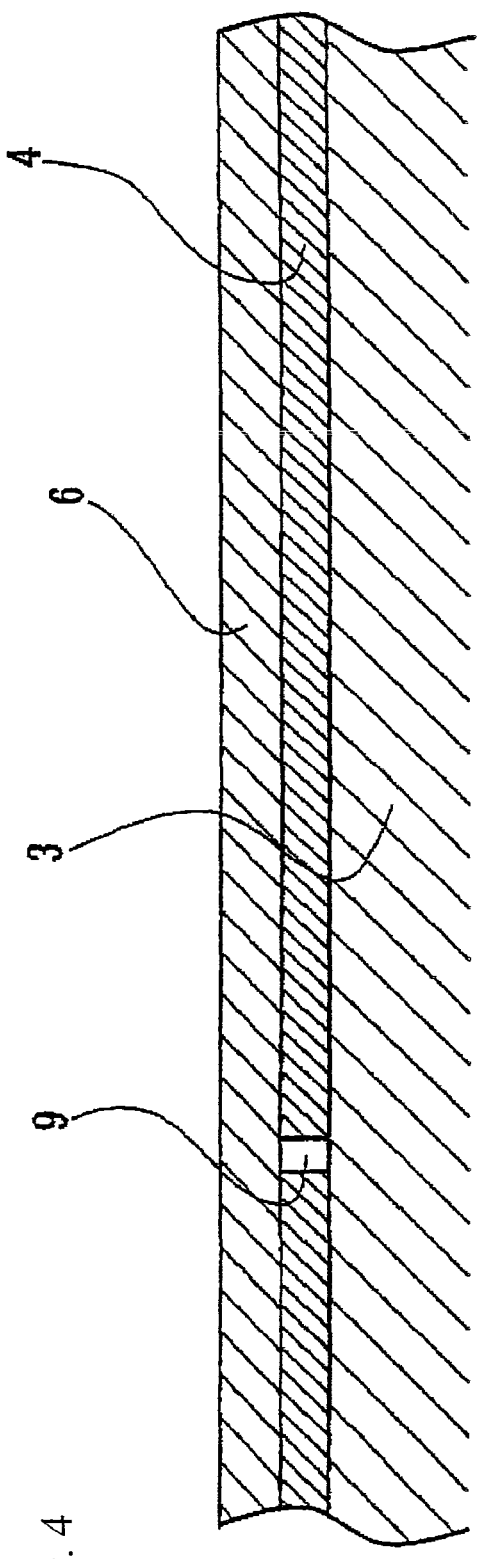
FIG. 4 is a partially enlarged cross-sectional view showing the case in which a pin-hole is formed in a Schottky electrode in a conventional Schottky barrier diode.

In the present embodiment, an intermediate metal film 5 made of nickel is formed between the Schottky electrode 4 and the pad electrode 6. As shown in the enlarged view of FIG. 2, in the manufacturing process of the SiC Schottky barrier diode, a pin-hole 9 is formed in the Schottky electrode 4 in some cases. In the case in which the pin-hole 9 is formed, a local Schottky junction is formed between the intermediate metal film 5 and the SiC epitaxial film 3.

An SBH at a junction formed between the intermediate metal film 5 made of nickel and the SiC epitaxial film 3 is higher than an SBH at a junction between the Schottky electrode 4 made of molybdenum and the SiC epitaxial film 3.

Consequently, a current flowing through the pin-hole 9 can be suppressed sufficiently, and an excess current flowing through the pin-hole 9 can be suppressed during a forward operation, and a reverse-direction leak current flowing through the pin-hole 9 can be sufficiently suppressed during a reverse operation.

In the present embodiment, the SiC single-crystal substrate 2 is a 4H—SiC single-crystal substrate in which $5 \times 10^{18}$ cm$^{-3}$ of nitrogen is doped as an impurity.

The SiC epitaxial film 3 is a 4H—SiC single crystal having a film thickness of 30 μm, which has been grown from the surface of the SiC single-crystal substrate 2 by CVD.

A numeral 8 represents an ion implanted layer (Junction Termination Extension (JTE)) formed in the peripheral section of the Schottky electrode 4. The ion implanted layer is formed by a heat treatment after the implantation of aluminum ions. The ion implanted layer 8 reduces an electric field concentration in the peripheral section of the Schottky electrode 4 to improve breakdown voltage.

The Schottky electrode 4 has a film thickness of 100 nm and is formed by a heat treatment after the deposition of molybdenum by the sputtering method.

The intermediate metal film 5 has a film thickness of 50 nm and is formed by a heat treatment after the deposition of molybdenum and then by the deposition of nickel by the sputtering method.

The pad electrode 6 has a film thickness of 2 μm and is formed by an electron beam deposition method.

The ohmic electrode 7 has a film thickness of 350 nm and is formed by a heat treatment after the deposition of nickel using an electron beam deposition method.

While the preferred embodiments of the present invention have been described above, the present invention is not restricted to the embodiments, and various changes and modifications can be thus made without departing from the scope of the present invention. An example will be described below.

For the present invention, an intermediate metal film is formed between the Schottky electrode and the pad electrode, in which an SBH between the intermediate metal film and the SiC epitaxial film is equivalent to or higher than an SBH between the Schottky electrode and the silicon carbide epitaxial film.

In general, an SBH that occurs by contact between a metal and an n-type semiconductor is represented by the formula of $q\Phi n = q(\Phi m - x)$, where $q\Phi n$ is an SBH at a junction between the metal and the n-type semiconductor, $\Phi m$ is a work function of the metal, and x is an electron affinity of the n-type semiconductor.

Thus, in the case in which the SiC epitaxial film is an n-type, the metal material of the intermediate metal film preferably has a work function almost equivalent to or larger than that of a metal material of the Schottky electrode.

On the other hand, an SBH that occurs by contact between a metal and a p-type semiconductor is represented by the formula of $q\Phi p = Eg - q(\Phi m - \chi)$, where $q\Phi p$ is an SBH at a junction between the metal and the p-type semiconductor, $\Phi m$ is a work function of the metal, $\chi$ is an electron affinity of the p-type semiconductor, and Eg is a band gap of the p-type semiconductor.

Thus, in the case in which the SiC epitaxial film is a p-type, the metal material of the intermediate metal film preferably has a work function almost equivalent to or smaller than that of a metal material of the Schottky electrode.

However, because the SBH changes by the heat treatment of the deposited metal that causes a formation of an alloy with SiC, the relationship of work functions of the metal materials of the intermediate metal film and the Schottky electrode is not necessarily restricted to the above description.

The following show preferable combinations of metal materials used for the Schottky electrode, the intermediate metal film and the pad electrode in the case in which the SiC epitaxial film is an n-type.

EXAMPLE 1

Schottky electrode: Ti (work function: 4.33 eV)
Intermediate metal film: Ni (work function: 5.15 eV)
Pad electrode: Al (work function: 4.28 eV)<

EXAMPLE 2

Schottky electrode: W (work function: 4.55 eV)
Intermediate metal film: Ni (work function: 5.15 eV)
Pad electrode: Al (work function: 4.28 eV)<

EXAMPLE 3

Schottky electrode: Ti (work function: 4.33 eV)
Intermediate metal film: Ni (work function: 5.15 eV)
Pad electrode: Mo (work function: 4.6 eV)<

EXAMPLE 4

Schottky electrode: W (work function: 4.55 eV)
Intermediate metal film: Ni (work function: 5.15 eV)
Pad electrode: Mo (work function: 4.6 eV)<

EXAMPLE 5

Schottky electrode: W (work function: 4.55 eV)
Intermediate metal film: Ni (work function: 5.15 eV)
Pad electrode: Ti (work function: 4.33 eV)

As a method for depositing the Schottky electrode and the intermediate metal film, a sputtering method, a vacuum deposition method, and an electron beam deposition method can be mentioned for instance.

As a method for depositing the pad electrode, a metal plating method, a sputtering method, a vacuum deposition method, and an electron beam deposition method can be mentioned for instance.

A SiC single-crystal substrate that is bulk grown by the improved Lely method or the CVD method can be used for the present invention.

Many kinds of crystal types can be used for the SiC single-crystal substrate. Examples include 4H—SiC (hexagonal four-fold periodicity), 6H—SiC (hexagonal six-fold periodicity), and 3C (cubic three-fold periodicity).

The crystal face and crystal orientation thereof of the SiC single-crystal substrate on which the epitaxial growth is performed are not restricted in particular. For example, the crystal face of the SiC single-crystal substrate on which the epitaxial growth is carried out may be a (0001) Si face, a (000-1) C face, a (11-20) face, a (01-10) face, or a (03-38) face.

In the case in which the epitaxial growth is carried out on the (0001) Si face or (000-1) C face, the substrate crystal is preferably cut while being inclined at an off-angle of 1 to 12° to the off-orientation of the [01-10] direction, the [11-20] direction, or a middle direction between the [01-10] direction and [11-20] direction, and the epitaxial growth of SiC from the crystal face of the substrate is carried out by the step flow growth technology. The surface of the SiC single-crystal substrate on which the epitaxial growth is performed is smoothed by polishing processing or the like. If necessary, the surface is processed and smoothed to be a mirror finished surface by a method such as hydrogen etching or chemical mechanical polishing (CMP).

The epitaxial growth of a SiC single-crystal film is carried out by CVD from the smoothed surface of the SiC single-crystal substrate. Propane or the like is used as a source gas of C, and silane or the like is used as a source gas of Si. A mixed gas of the source gases, carrier gases such as hydrogen, and a dopant gas is supplied to the surface of the SiC single-crystal substrate to carry out the epitaxial growth of SiC. By the above step, the step flow growth of the SiC single crystal is carried out with the same crystal type as that of the SiC single-crystal substrate to form the SiC epitaxial film.

For the present invention, conventional publicly known many kinds of means and structures such as the ion implanted layer as described in the above embodiment can be provided to reduce the electric field concentration in the peripheral section of the Schottky electrode. In the above embodiment, the aluminum ion concentration in the ion implanted layer 8 is controlled in such a manner that the aluminum ion concentration is decreased from the center toward the outside. The aluminum ion concentration is $2.2 \times 10^{18}$ $cm^{-3}$ at the center and $3 \times 10^{17}$ $cm^{-3}$ at the outside. After the implantation of aluminum ions, a heat treatment is carried out at a temperature such as 1700° C. to electrically activate aluminum.

Although not shown in the figures in accordance with the above embodiment, an oxide film such as $SiO_2$ is formed on appropriate sections such as on the surface of the SiC epitaxial film of the Schottky diode, for the purpose of protection of the device.

The ohmic electrode, the Schottky electrode, the intermediate metal film, and the pad electrode can be formed by photolithography using a resist. In an exemplary method of forming the electrodes and the like by photolithography, a protective oxide film is formed on the surface of the SiC single-crystal substrate or the SiC epitaxial film by heating, then the protective oxide film is covered with a resist film having openings at predetermined positions, and the protective oxide film exposed from the openings is removed by using buffered hydrofluoric acid or the like. Alternatively, there may be used a method in which a predetermined metal film is deposited, a resist film is formed on regions where the electrode or the like will be formed, and the metal film exposed from the resist film is removed by etching.

A metal film to be the ohmic electrode is formed on the rear face of the SiC single-crystal substrate by using the above photolithography technology. A heat treatment (sintering treatment) is then carried out in the atmosphere of an inert gas such as argon or nitrogen to form an alloy with SiC, thereby forming the ohmic electrode.

After the ohmic electrode is formed, a metal film to be the Schottky electrode is formed on the surface of the SiC epitaxial film by using the photolithography technology. Subsequently, a metal film to be the intermediate metal film is formed on the Schottky metal film, and a heat treatment (sintering treatment) is then carried out in the atmosphere of an inert gas such as argon or nitrogen to form the Schottky electrode. After that, a metal film to be the pad electrode is formed on the intermediate metal film by using the above photolithography technology.

The Schottky diode in accordance with the present invention is electrically connected to an external circuit such as a circuit board via the pad electrode by a method such as wire bonding using aluminum or the like, solder connection or terminal connection. For instance, the pad electrode is wire bonded to a terminal, and the diode is encapsulated with a general-purpose encapsulating resin while each end of the terminal is exposed, thereby giving a semiconductor device as a resin encapsulated package. Such a semiconductor device can also be a semiconductor module in which a plurality of Schottky diodes or device structures other than the Schottky diodes are formed on one SiC single-crystal substrate.

The Schottky diode in accordance with the present invention is preferably suitable for a Schottky diode having a reverse breakdown voltage in the range of about 0.6 to 5.0 kV for instance.

The Schottky diode in accordance with the present invention is not restricted to a diode in which a pin-hole is formed in the Schottky electrode. For the Schottky diode in accordance with the present invention, a yield can be improved by mass production of diodes provided with an intermediate metal film.

The invention claimed is:

1. In a Schottky barrier diode comprising a Schottky electrode formed on the surface of a silicon carbide epitaxial film grown from the surface of a silicon carbide single-crystal substrate, and a pad electrode formed on the Schottky electrode for being electrically connected to the outside, the improvement comprising an intermediate metal film between the Schottky electrode and the pad electrode, wherein a Schottky barrier height between the intermediate metal film and the silicon carbide epitaxial film is equivalent to or higher than a Schottky barrier height between the Schottky electrode and the silicon carbide epitaxial film and a Schottky barrier height between the pad electrode and the silicon carbide epitaxial film is lower than the Schottk barrier height between the Schottky electrode and the silicon carbide epitaxial film and wherein the Schottky electrode is made of W, the intermediate metal film is made of Ni and the pad electrode is made of Mo or Ti.

2. In use of the Schottky barrier diode of claim 1 by passing a current in a forward direction and a reverse direction that are switched, the improvement comprising preventing an excess current from passing through a pin-hole in the Schottky electrode by the intermediate metal film during the forward operation.

3. In use of the Schottky barrier diode of claim 1 by passing a current in a forward direction and a reverse direction that are switched, the improvement comprising preventing the current from leaking in a reverse direction through a pin-hole in the Schottky electrode by the intermediate metal film.

* * * * *

UNITED STATES PATENT AND TRADEMARK OFFICE
CERTIFICATE OF CORRECTION

| | | |
|---|---|---|
| PATENT NO. | : 8,178,940 B2 | Page 1 of 1 |
| APPLICATION NO. | : 12/094922 | |
| DATED | : May 15, 2012 | |
| INVENTOR(S) | : Tomonori Nakamura et al. | |

It is certified that error appears in the above-identified patent and that said Letters Patent is hereby corrected as shown below:

Column 6, Line 48, Claim 1, delete "Schottk" and insert -- Schottky --

Signed and Sealed this
Fourth Day of September, 2012

David J. Kappos
*Director of the United States Patent and Trademark Office*